(12) United States Patent
Kasahara et al.

(10) Patent No.: US 11,414,278 B2
(45) Date of Patent: Aug. 16, 2022

(54) MULTI-LEVEL HAND APPARATUS AND CONVEYING ROBOT PROVIDED WITH THE SAME

(71) Applicant: DAIHEN Corporation, Osaka (JP)

(72) Inventors: Kimihiro Kasahara, Osaka (JP); Kunio Fukuma, Osaka (JP)

(73) Assignee: DAIHEN Corporation, Osaka (JP)

( * ) Notice: Subject to any disclaimer, the term of this patent is extended or adjusted under 35 U.S.C. 154(b) by 462 days.

(21) Appl. No.: 16/719,128

(22) Filed: Dec. 18, 2019

(65) Prior Publication Data

US 2020/0198902 A1 Jun. 25, 2020

(30) Foreign Application Priority Data

Dec. 21, 2018 (JP) .............................. JP2018-239742

(51) Int. Cl.
*B65G 47/90* (2006.01)
*H01L 21/677* (2006.01)

(52) U.S. Cl.
CPC ........ *B65G 47/90* (2013.01); *H01L 21/67781* (2013.01); *B65G 2203/044* (2013.01); *Y10S 294/902* (2013.01); *Y10S 414/141* (2013.01); *Y10S 901/30* (2013.01)

(58) Field of Classification Search
None
See application file for complete search history.

(56) References Cited

U.S. PATENT DOCUMENTS

| 5,217,340 | A | * | 6/1993 | Harada | H01L 21/67781 414/331.14 |
| 5,562,387 | A | * | 10/1996 | Ishii | H01L 21/67781 414/217 |
| 6,113,165 | A | * | 9/2000 | Wen | H01L 21/68707 414/941 |
| 6,438,460 | B1 | * | 8/2002 | Bacchi | H01L 21/68707 700/250 |
| 7,281,741 | B2 | * | 10/2007 | Woodruff | H01L 21/67259 414/744.8 |
| 9,254,566 | B2 | * | 2/2016 | Hashimoto | B25J 11/0095 |
| 9,343,341 | B2 | * | 5/2016 | Hashimoto | H01L 21/67781 |

(Continued)

FOREIGN PATENT DOCUMENTS

JP 2013-135099 A 7/2013

*Primary Examiner* — Michael S Lowe
(74) *Attorney, Agent, or Firm* — Hamre, Schumann, Mueller & Larson, P.C.

(57) ABSTRACT

A multi-level hand apparatus includes a plurality of hands arranged in a vertical direction, and a plurality of clamp members disposed at the plurality of hands, respectively. Each of the clamp members is movable in a forward-rearward direction to clamp and release a workpiece. The apparatus further includes a movable head member extending in the vertical direction. Each clamp member includes a fixed spring receiving member, a movable spring receiving member movable in the forward-rearward direction, and a compression spring member arranged between the fixed spring receiving member and the movable spring receiving member. In each clamp member, the movable spring receiving member, as moving rearward, comes into contact with a front surface of the movable head member in a manner such that the movable spring receiving member is capable of moving in the vertical direction relative to the front surface.

8 Claims, 12 Drawing Sheets

(56) References Cited

U.S. PATENT DOCUMENTS

| | | | |
|---|---|---|---|
| 10,720,356 B2* | 7/2020 | Nagakubo | H01L 21/6719 |
| 11,244,846 B2* | 2/2022 | Hudgens | H01L 21/67754 |
| 11,257,707 B2* | 2/2022 | Dogome | H01L 21/67259 |
| 2004/0018745 A1* | 1/2004 | Tashiro | H01L 21/68 |
| | | | 438/758 |
| 2005/0123383 A1* | 6/2005 | Goto | H01L 21/68707 |
| | | | 414/416.08 |
| 2015/0016935 A1 | 1/2015 | Hashimoto et al. | |

\* cited by examiner

MULTI-LEVEL HAND APPARATUS AND CONVEYING ROBOT PROVIDED WITH THE SAME

FIELD

The present disclosure relates to a multi-level hand apparatus capable of conveying plate-shaped workpieces collectively, and also relates to a conveying robot provided with the multi-level hand apparatus.

BACKGROUND

A multi-level hand apparatus that can convey multiple plate-shaped workpieces such as semiconductor wafers at the same time is described in JP-A-2013-135099, for example. This conventional multi-level hand apparatus is configured such that the hand pitch can be changed in order to be able to convey groups of workpieces between cassettes of different pitches.

JP-A-2013-135099 also discloses a clamp mechanism for individually holding workpieces that have been placed on the hands of the multi-level hand apparatus. This clamp mechanism has springs that constantly bias clamp members in the forward direction (a clamping direction) on the hands, and a moving member for pulling the clamp members rearward all at once in resistance to the biasing force of the springs. The moving member is moved in the forward-rearward direction (a clamping direction and a releasing direction) by an actuator. When workpieces are not being clamped, the moving member moves rearward (releasing direction) so as to pull the clamp members rearward in resistance to the biasing force. When workpieces are to be clamped, the moving member moves forward, and at this time, even after the clamp members have come into contact with the workpieces, the moving member moves farther forward by a predetermined distance so as to separate from the clamp members in the forward direction. This is done in order to avoid the case where the moving member and the clamp members rub against each other when the hand pitch is changed while workpieces are held on the hands.

However, with the conventional configuration described above, in the released state, the moving member needs to be held in the rearward state in resistance to the total biasing force of the springs that bias the clamp members in the forward direction on the hands.

This requires an increase in the output of the actuator for moving the moving member forward and rearward, and means that energy is required in order to maintain the rearward-pulled state of the moving member, thus leading to the problem that excessive functionality is required from the actuator. This problem becomes more prominent when there is an increase in the number of hands that are moved all at once.

SUMMARY

In light of the above circumstances, the present disclosure aims to make it possible for workpieces to be clamped and released more efficiently in a multi-level hand apparatus of a variable hand pitch.

According to a first aspect of the present disclosure, there is provided a multi-level hand apparatus including: a plurality of hands arranged in a vertical direction; a plurality of clamp members disposed at the plurality of hands, respectively, where each of the clamp members is movable in a forward-rearward direction to clamp and release a workpiece; and a movable head member extending in the vertical direction. Each of the clamp members includes a fixed spring receiving member, a movable spring receiving member movable in the forward-rearward direction, and a compression spring member arranged between the fixed spring receiving member and the movable spring receiving member. In each of the clamp members, the movable spring receiving member, as moving rearward, comes into contact with a front surface of the movable head member in a manner such that the movable spring receiving member is capable of moving in the vertical direction relative to the front surface.

Preferably, each of the clamp members includes a rod extending in the forward-rearward direction, and a clamp body disposed at a leading end of the rod for pressing a workpiece. Each of the hands is provided with a holder configured to support a portion of the rod that is forward of the fixed spring receiving member in a manner allowing the rod to move in the forward-rearward direction, and the compression spring member is a compression coil spring surrounding the rod.

Preferably, in each of the hands, the movable spring receiving member includes a roller that comes into contact with and rolls on the front surface of the head member.

Preferably, each of the hands is provided with an optical detector that optically detects unsuitable pressing of the workpiece by the clamp body when the clamp member is in the clamping state.

Preferably, in each of the hands, the optical detector includes a light receiving element provided on each of the hand and a reflection state changing portion formed in the clamp body.

Preferably, in each of the hands, the reflection state changing portion is a through-hole passing through the clamp body in the vertical direction.

Preferably, the pitches of the plurality of hands are variable.

According to a second aspect of the present disclosure, there is provided a conveying robot incorporating a multi-level hand apparatus according to the first aspect of the present disclosure.

In accordance with the above-noted configurations, the following advantages can be enjoyed. To release the workpieces, the movable head member is moved rearward, and thus the clamp members being engaged with the movable head member also move rearward, thereby releasing the workpieces. At this time, the movable spring receiving members are in elastic contact with the movable head member that is engaged with the clamp members. Thus, the compression spring members are not compressed between the movable spring receiving members and the fixed spring receiving members. In other words, when the workpieces are released, the movable head member is substantially not influenced by the compression spring members pertaining to the clamp members of the hands, and when the movable head member moves rearward, the compression spring members do not become compressed. Accordingly, when the workpieces are released, the movable head member does not need to be held in the rearward state in resistance to the total biasing force of the springs that bias the clamp members forward as in the configuration disclosed in JP-A-2013-135099, and there is no need for an increase in the output of the actuator that drives the movable head member as in JP-A-2013-135099.

To clamp the workpieces, the movable head member receives elastic force from the compression spring members via the movable spring receiving members, but the movable spring receiving members can undergo relative movement in the vertical direction with low resistance while in contact with the front surface of the movable head member. Thus it is possible to prevent problems from occurring when the hand pitch of the hands is changed in the clamping state.

Other features and advantages of the present disclosure will become apparent from the detailed description given below with reference to the drawings.

EMBODIMENTS

Embodiments of various aspects of the present disclosure will be described below in detail with reference to the drawings.

Figure 1:
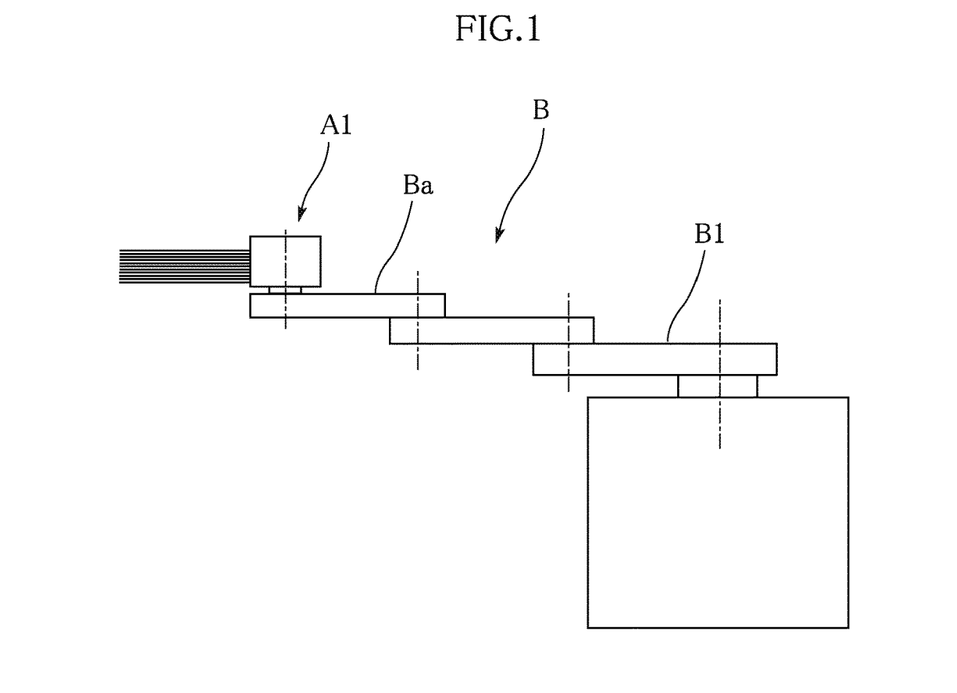
FIG. 1 is an overall configuration view of an example of a conveying robot provided with a multi-level hand apparatus according to the present disclosure.
Figure 2:
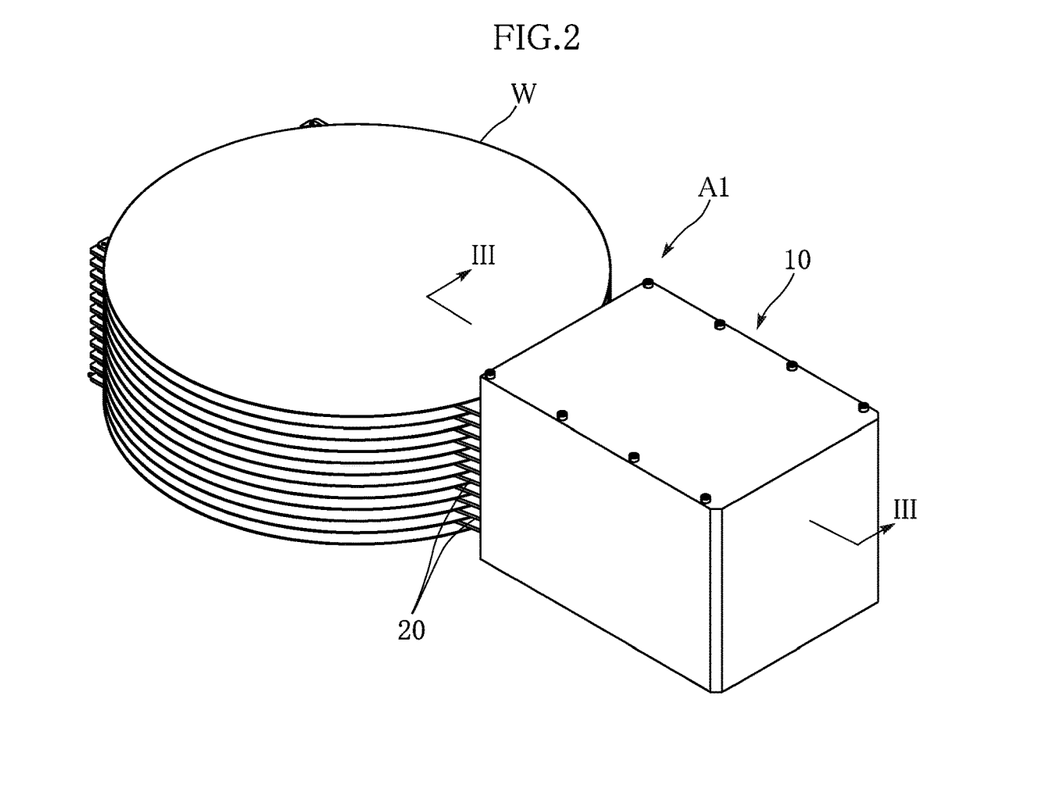
FIG. 2 is an overall perspective view of an example of the multi-level hand apparatus according to the present disclosure.

As shown in FIG. 1, according to an aspect of the present disclosure, a multi-level hand apparatus A1 according to the present disclosure is provided on an effector mount arm Ba of an articulated robot B1 or the like, thus constituting a conveying robot B. The conveying robot B may have any configuration as long as the leading end of the effector mount arm Ba can be moved three-dimensionally with a controlled orientated.

FIGS. 2 to 9 show the multi-level hand apparatus A1 according to a first embodiment of the present disclosure. This multi-level hand apparatus A1 includes a containing box 10, multiple hands 20 that are overlaid vertically, a guide (FIGS. 4 and 9) that allows and guides movement of the hands 20 in the vertical direction while maintaining the orientation thereof, a hand pitch limiter 50 (FIG. 9) that limits or defines the maximum hand pitch of the hands 20, and an elevating mechanism 60 that raises/lowers the top hand (first hand 20a).

Figure 3:
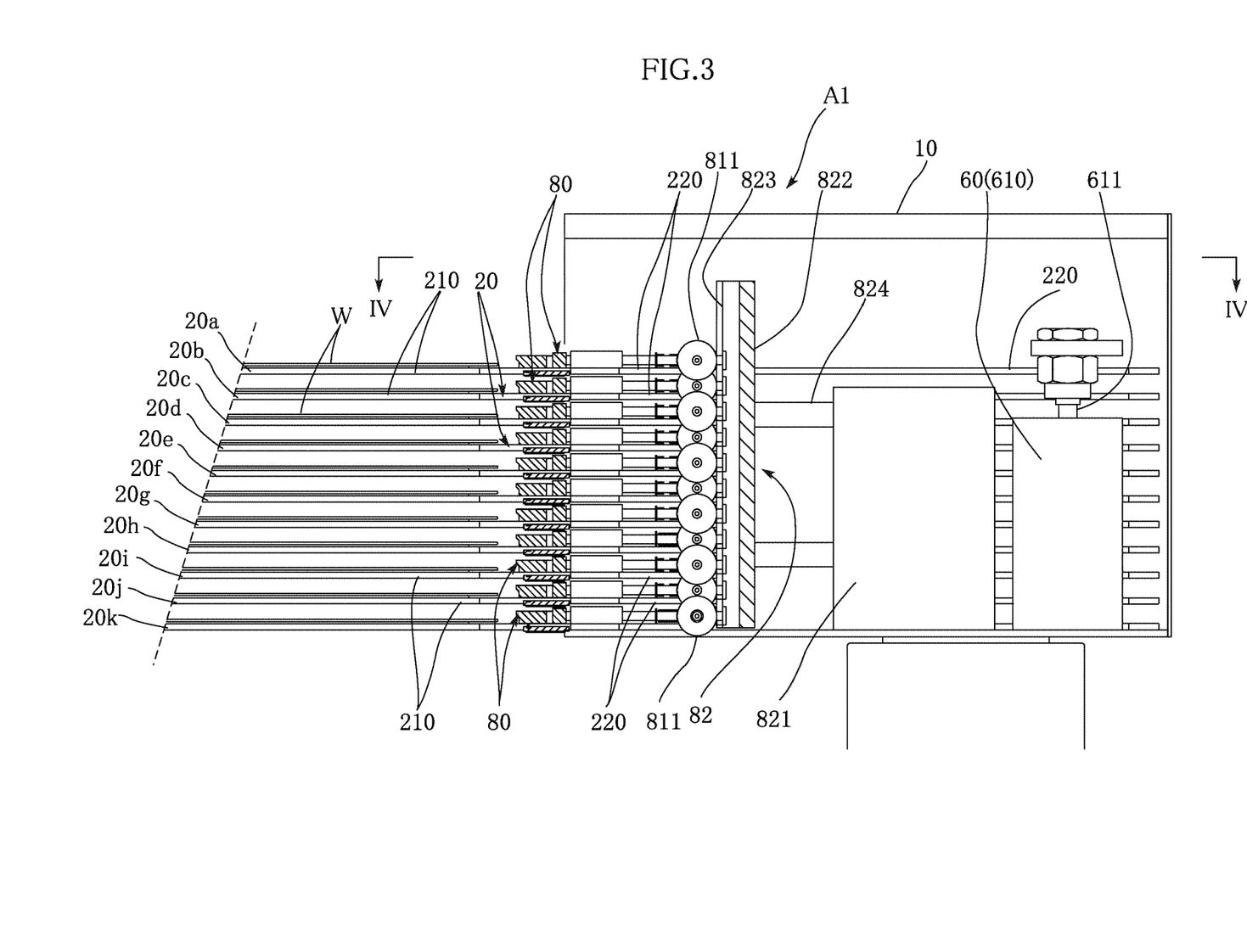
FIG. 3 is a cross-sectional view taken along line III-III in FIG. 2.
Figure 4:
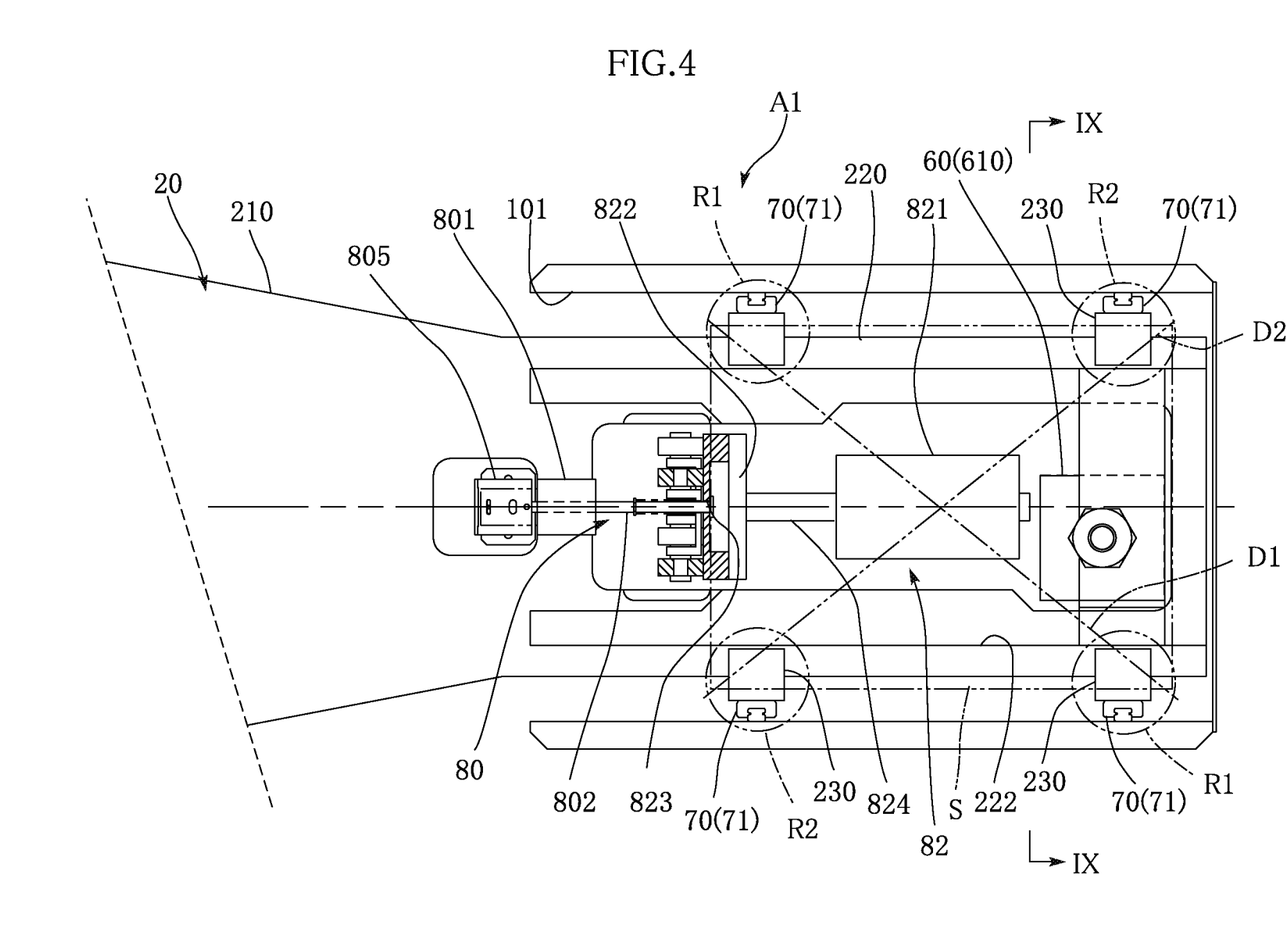
FIG. 4 is a cross-sectional view taken along line IV-IV in FIG. 3.

In the present embodiment, the hands 20 are each configured for the placement and conveying of a plate-shaped workpiece W, which is a circular silicon wafer for semiconductor manufacturing, and each include a two-pronged fork-like hand body 210 (FIG. 8) at the leading end side and a support body 220 that is coupled to the base portion of the hand body 210. The hand body 210 is mainly formed from a lightweight and hard material such as carbon fiber reinforced plastic, and the support body 220 is molded from metal, a hard resin, or the like. The hands 20 are overlaid on each other in the vertical direction. Specifically, the guide 70 allows and guides free movement of the support bodies 220 of the hands 20 in the vertical direction inside the containing box 10 while maintaining the horizontal orientation of the support bodies 220, and the hand bodies 210 extend out from a front opening 101 of the containing box 10 (FIGS. 3 and 4). In the present embodiment, the support body 220 of the bottom hand (eleventh hand 20k) is fixed to a bottom portion of the containing box 10, and ten hands (first to tenth hands 20a to 20j from top to bottom), which are guided by the guide 70 as described above, are arranged over the bottom hand (FIGS. 3 and 9).

Each hand 20 is provided with a clamp mechanism 80 that moves in coordination with claws 211 (FIG. 8) provided on the hand body 210 to hold a workpiece W placed on the hand body 210, and a clamp driving mechanism 82 is provided in order to cause the clamp mechanisms 80 of the hands 20 to operate at the same time, but this will be described later.

Figure 13:
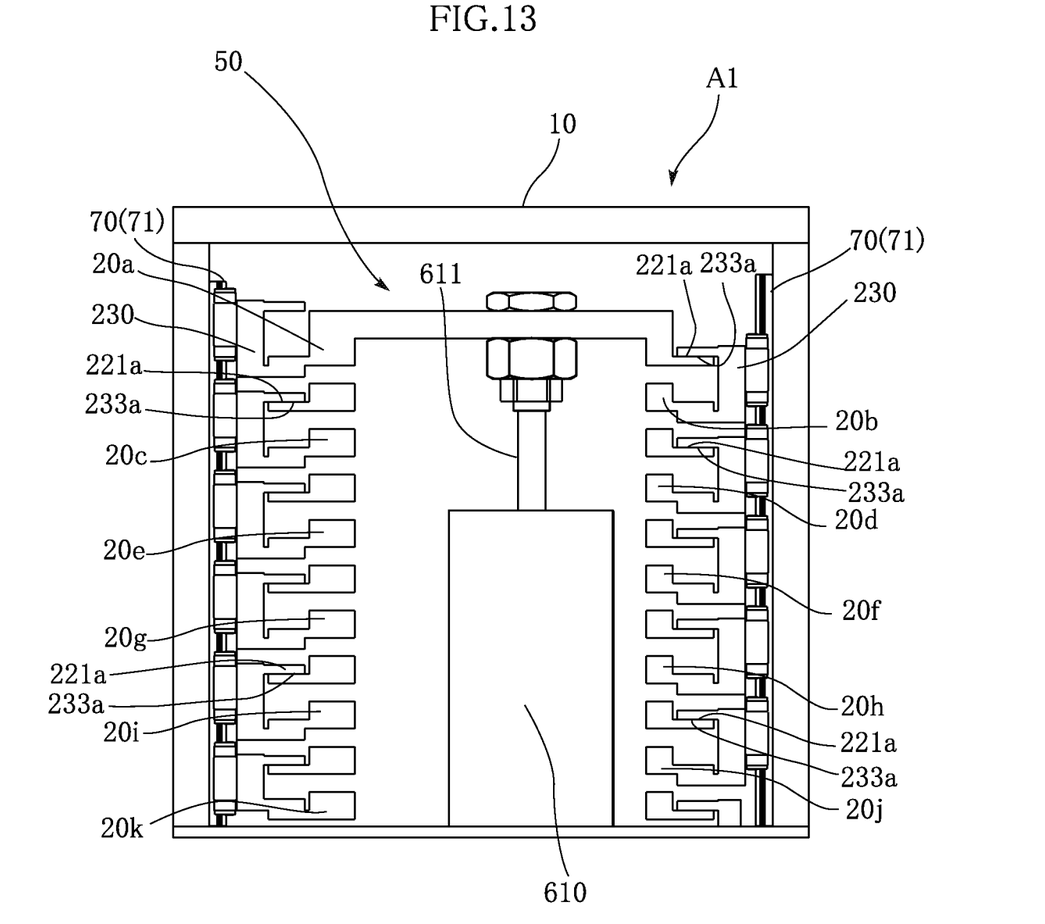
FIG. 13 is a diagram illustrating operations of the hand pitch limiter, and corresponds to the cross-sectional view taken along line IX-IX in FIG. 4.

As show in detail in FIGS. 9 to 13, the eleven hands 20a to 20k are divided into two groups, namely first-group hands including the top first hand 20a and the subsequent odd-numbered hands at every other position (first, third, fifth, seventh, and ninth hands 20a, 20c, 20e, 20g, 20i, and 20k), and second-group hands including the remaining even-numbered hands (second, fourth, sixth, eighth, and tenth hands 20b, 20d, 20f, 20h, and 20j), and the hand pitch limiter 50 is configured to limit or define the maximum pitch between the first-group hands 20a, 20c, 20e, 20g, 20i, and 20k that are located on the upper side and the second-group hands 20b, 20d, 20f, 20h, and 20j that are located directly below those first-group hands by abutment between upward abut portions 221a (FIG. 9) provided on the first-group hands 20a, 20c, 20e, 20g, 20i, and 20k and downward abut portions 233a (FIG. 9) provided on the second-group hands 20b, 20d, 20f, 20h, and 20j (FIG. 13), and to also limit or define the maximum pitch between the second-group hands 20b, 20d, 20f, 20h, and 20j that are located on the upper side and the first-group hands 20a, 20c, 20e, 20g, 20i, and 20k that are located directly below those second-group hands by abutment between upward abut portions 221a provided on the second-group hands 20b, 20d, 20f, 20h, and 20j and downward abut portions 233a provided on the first-group hands 20a, 20c, 20e, 20g, 20i, and 20k (FIG. 13).

In the present embodiment, the upward abut portions 221a are constituted by upper surfaces of limit pieces 221 that extend laterally from the support bodies 220 of the hands 20. Also, the hands 20 each have a substantially U-shaped block 230 (sharp-cornered "U") that includes a lateral extension portion 231 that extends laterally from the support body 220, an upward extension portion 232 that extends upward from the leading end of the lateral extension portion 231, and a folded extension portion 233 that extends from an upper portion of the upward extension portion 232 toward the support body 220 of the hand 20, and the downward abut portions 233a are constituted by lower surfaces of the folded extension portions 233.

Also, in the present embodiment, sets of the upward abut portions 221a of the first-group hands 20a, 20c, 20e, 20g, 20i, and 20k and the downward abut portions 233a of the second-group hands 20b, 20d, 20f, 20h, and 20j are overlaid on each other in the vertical direction at first planar positions (hereinafter, these overlaid portions will be called first-set abutting relationship portions R1 (FIG. 4)), and sets of the upward abut portions 221a of the second-group hands 20b, 20d, 20f, 20h, and 20j and the downward abut portions 233a of the first-group hands 20a, 20c, 20e, 20g, 20i, and 20k are overlaid on each other in the vertical direction at second planar positions that are different from the first planar positions (hereinafter, these overlaid portions will be called second-set abutting relationship portions R2 (FIG. 4)). More specifically, as shown in FIG. 4, the support bodies 220 of the hands 20 have a substantially rectangular virtual region S in a plan view, the first-set abutting relationship portions R1 are provided at two locations on one diagonal line D1 of the substantially rectangular virtual region S, and the second-set abutting relationship portions R2 are provided at two locations on another diagonal line D2. In other words, one first-set abutting relationship portion R1 and one second-set abutting relationship portion R2 are arranged opposing each other in the width direction of the support body 220 of the hand 20 on both the front side and the rear side of the substantially rectangular virtual region S, and the left-right relationship between the first-set abutting relationship portion R1 and the second-set abutting relationship portion R2 in the front portion is opposite to that in the rear portion.

The guide 70 is configured by linear guides 71 that have tracks extending in the vertical direction, are provided at the first-set abutting relationship portions R1 (two locations) and the second-set abutting relationship portions R2 (two locations), and guide the blocks 230 that are overlaid in the vertical direction.

Also, the support bodies 220 of the hands 20 (excluding the first hand 20a) are each provided with a through-hole 222 that extends in the thickness direction, thus forming a space for arrangement of the elevating mechanism 60 and the clamp driving mechanism 82.

The elevating mechanism 60 is configured by an air cylinder 610 that is arranged extending upward on a bottom portion of the containing box 10, and a piston rod 611 whose leading end is coupled to the support body 220 of the first hand 20a located at the top. Besides an air cylinder, another linear actuator can be used in the elevating mechanism 60.

The hands 20 are each provided with the clamp mechanism 80 that moves in coordination with the claws 211 provided on the hand body 210 to hold a workpiece W placed on the hand body 210. The clamp mechanisms 80 are configured to perform clamp holding and clamp releasing all at once even if the pitch between the hands 20 is changed. Furthermore, the clamp mechanisms 80 are each provided with a clamp sensor (optical detector) 83 (FIGS. 6 and 7) that detects unsuitable holding of a workpiece W. The aforementioned aspects will be described in order below.

The clamp mechanisms 80 are each configured by a clamp member 80a having a holder 801 arranged on the support body 220 of the hand 20, a rod 802 held by the holder 801 so as to be capable of moving in the axial direction but not rotating in the axial direction, and a clamp body 805 attached to the leading end of the rod 80, and the rods 802 move forward and rearward all at once.

Figure 5:
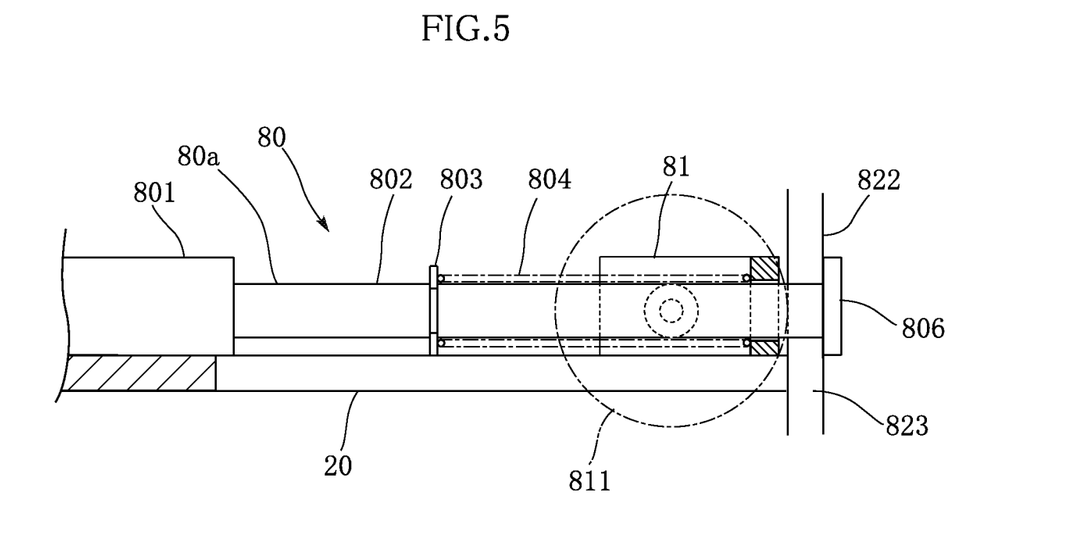
FIG. 5 is a diagram illustrating a rear portion of a clamp mechanism.
Figure 6:
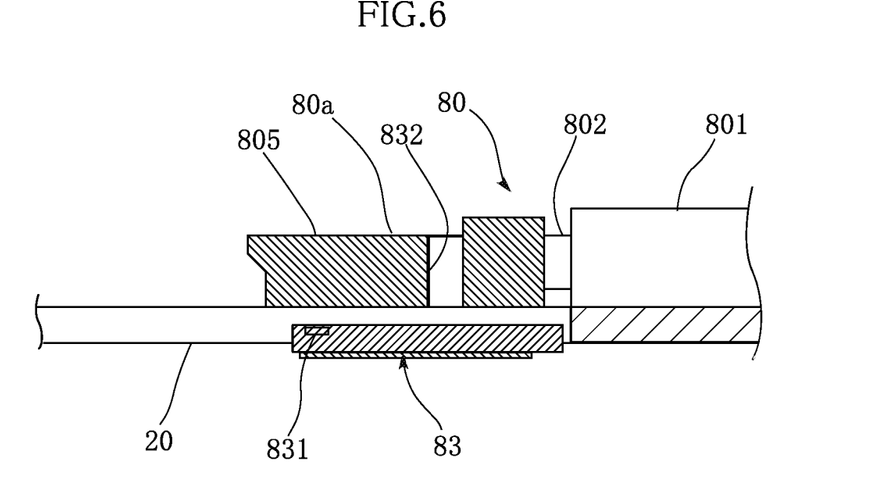
FIG. 6 is a diagram illustrating a front portion of the clamp mechanism.
Figure 7:
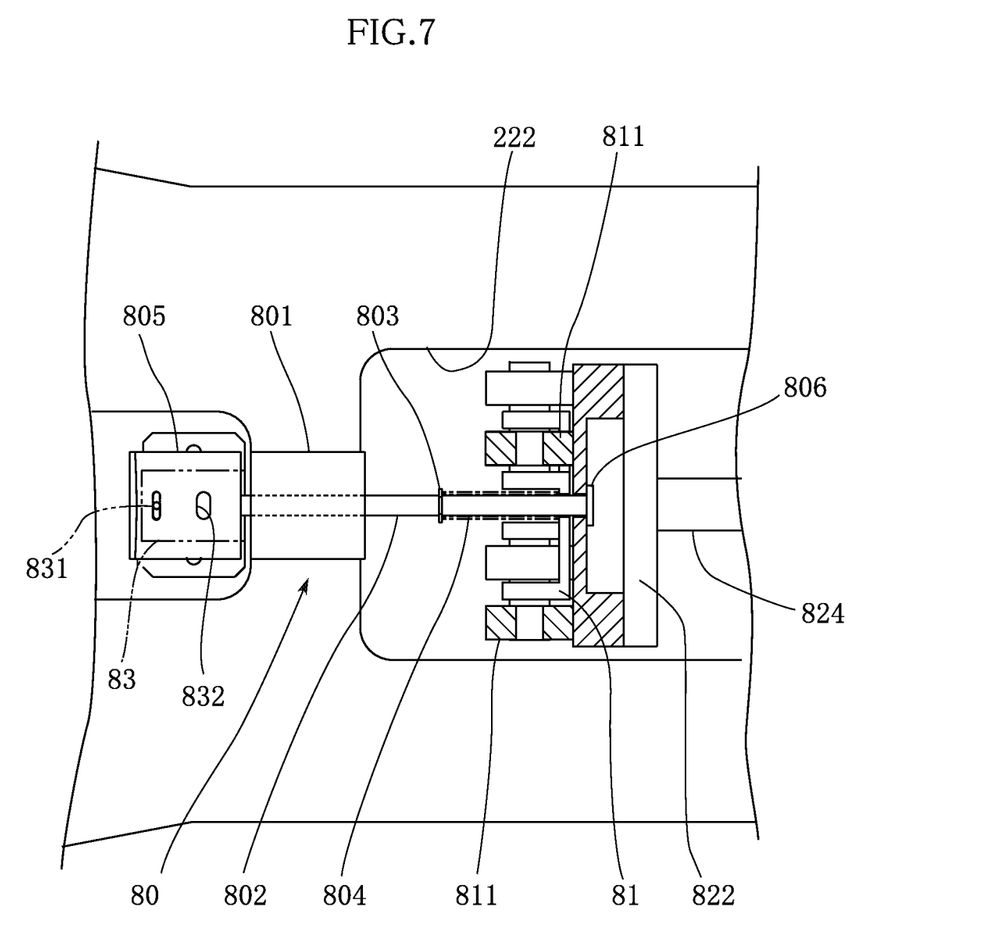
FIG. 7 is a plan view of the clamp mechanism.
Figure 8:
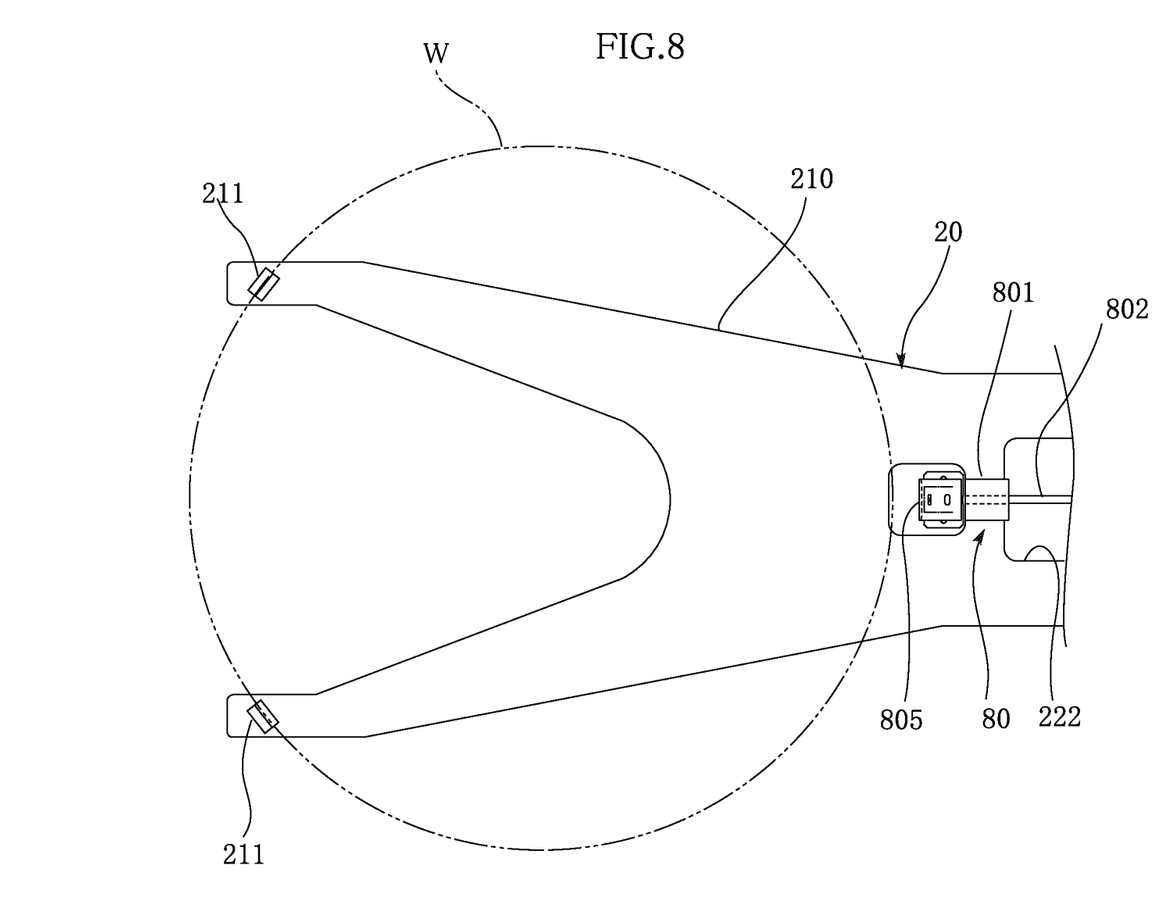
FIG. 8 is a plan view of a front portion (hand body) of a hand.

As shown in FIGS. 4 to 6, a flange (fixed spring receiving member) 803 is provided on the rod 802, a spring receiving member (movable spring receiving member) 81 is arranged rearward of the flange 803 and can slide in the axial direction relative to the rod 802 but cannot rotate about the axis of the rod 802, and the rod 802 is constantly biased in the forward direction by a compression coil spring 804 that is a compression spring member that extends between the flange 803 and the spring receiving member 81. A portion of the rod 802 that is rearward of the spring receiving member 81 is inserted through a slit 823 that is formed extending in the vertical direction in a head member (moving body) 822 that is elongated in the vertical direction and is moved forward and rearward by a horizontal air cylinder 821 that serves as the later-described clamp driving mechanism 82. A flange 806 that cannot pass through the slit 823 is formed at the rear end of the rod 802. The spring receiving member 81 is provided with a pair of rollers 811 that are respectively arranged on the left and right sides with respect to the axial direction of the rod 802, and are in contact with and can roll on the front surface of the head member 822. In order to prevent interference between the rollers 811 of hands 20 that are adjacent in the vertical direction, the rollers 811 provided in the second-group hands 20b, 20d, 20f, 20h, and 20j are displaced in the left-right direction from the rollers 811 provided in the first-group hands 20a, 20c, 20e, 20g, 20i, and 20k.

The clamp sensors 83 each include a limited reflection-type sensor (light receiving element) 831 that is provided on the hand body 210, and a through-hole (reflection state changing portion) 832 that passes through the clamp body 805 in the vertical direction, and if a workpiece W is held suitably, light passes through the through-hole 832, reflected light is not detected, and the limited reflection-type sensor 831 is in the off state, whereas if a workpiece W is not held suitably, light is reflected by the lower surface of the clamp body 805, the reflected light is detected, and the limited reflection-type sensor 831 enters the on state.

The following describes operations of the multi-level hand apparatus A1 having the above-described configuration.

Figure 9:
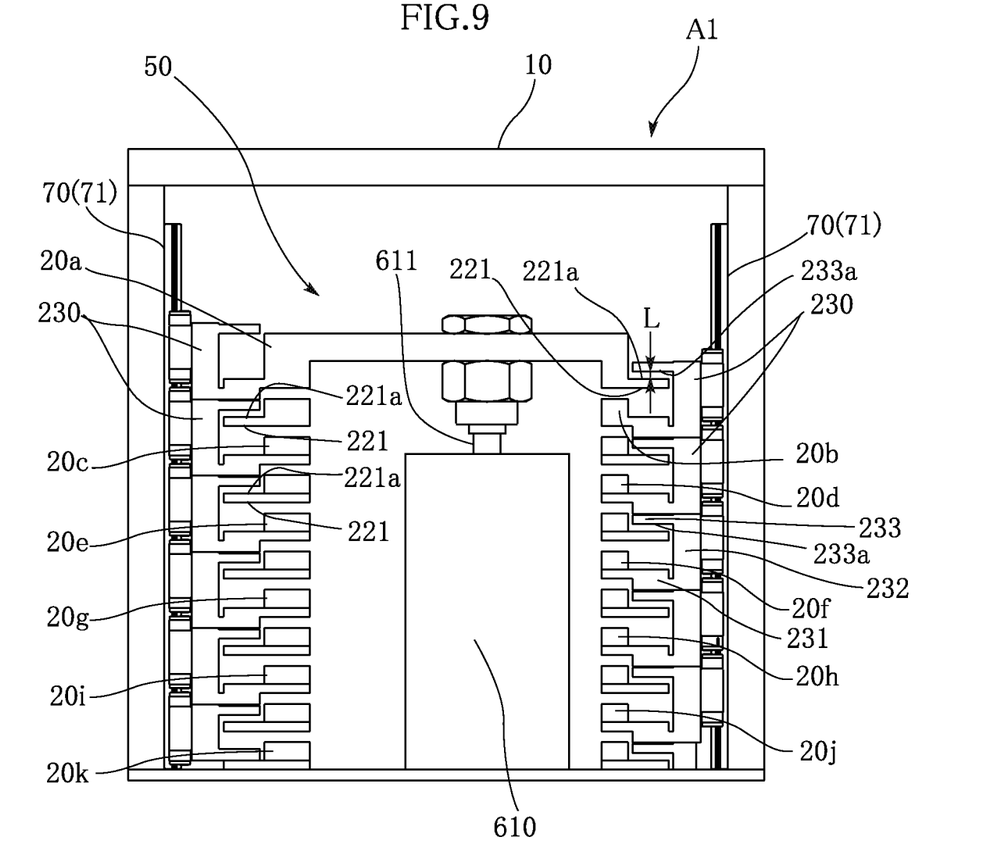
FIG. 9 is a cross-sectional view taken along line IX-IX in FIG. 4.

First, operations pertaining to changing the hand pitch of the hands 20 will be described. FIG. 9 shows a cross-section taken along line IX-IX in FIG. 4, and shows the state where the hand pitch is the minimum pitch. The piston rod 611 of the elevating mechanism 60 is at the lowest position. In this state, the blocks 230 of the first-group hands 20a, 20c, 20e, 20g, 20i, and 20k in the first-set abutting relationship portions R1 (FIG. 4) and the blocks 230 of the second-group hands 20b, 20d, 20f, 20h, and 20j in the second-set abutting relationship portions R2 are stacked on each other in the vertical direction. The minimum pitch of the hands 20 is defined by this vertical stacking of the blocks 230. Note that in this state, the upward abut portion 221a of a hand 20 on the upper side and the downward abut portion 233a of the hand 20 immediately therebelow are separated and do not abut against each other. At this time, the hand pitch is considered to be 7.0 mm, for example. According to this configuration, there is no need for a separate configuration for limiting the hand pitch to a minimum pitch.

Figure 10:
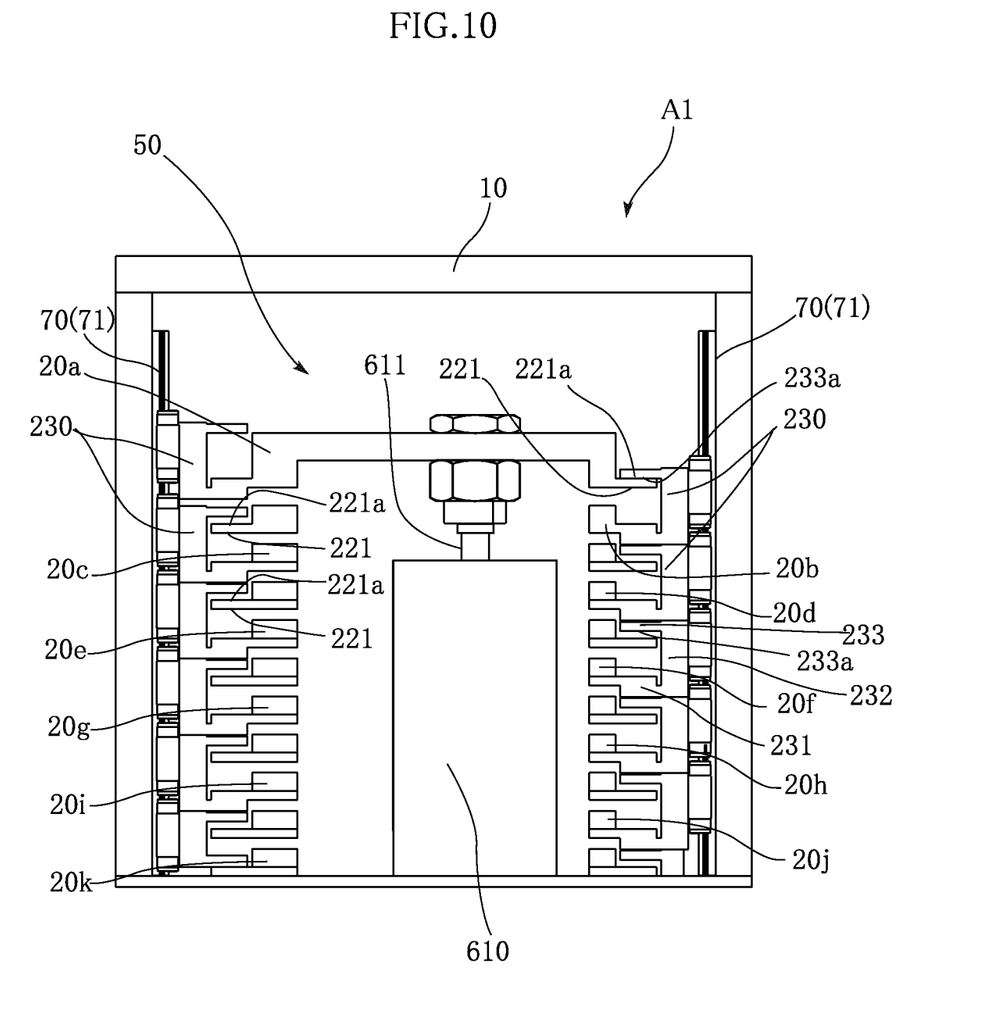
FIG. 10 is a diagram illustrating operations of a hand pitch limiter, and corresponds to the cross-sectional view taken along line IX-IX in FIG. 4.
Figure 11:
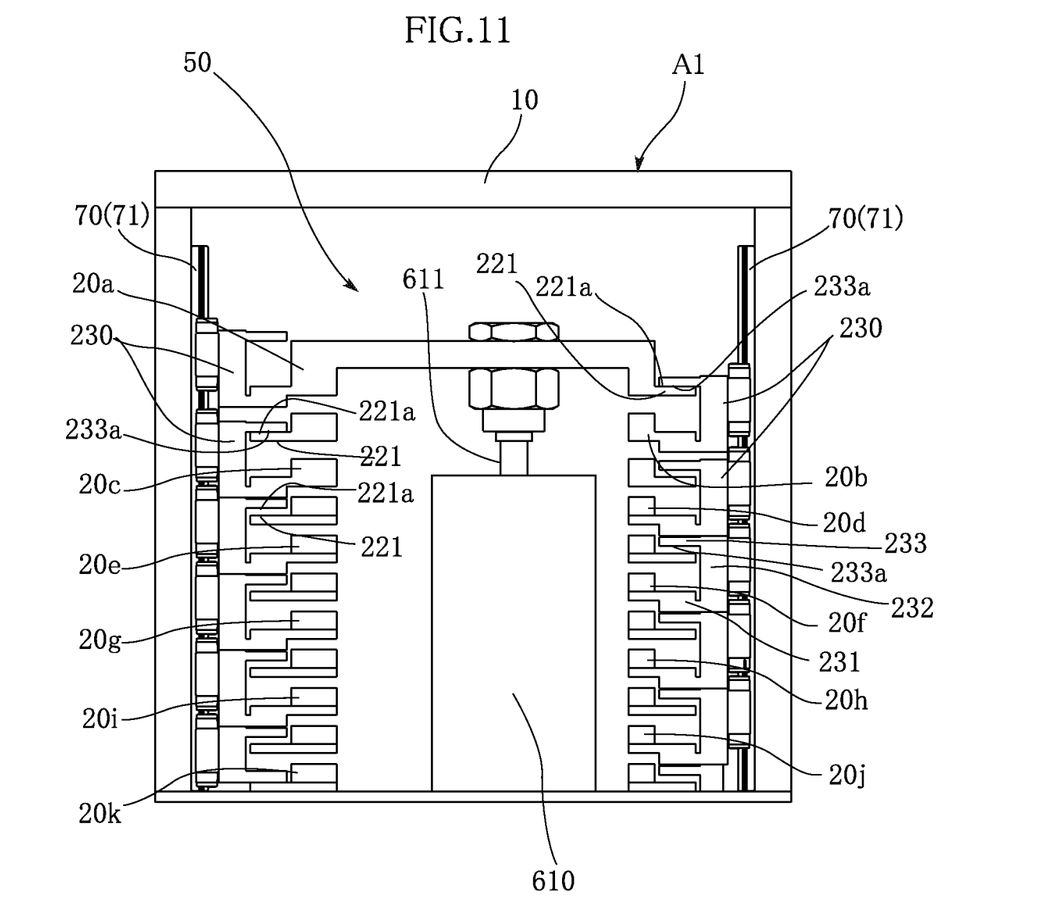
FIG. 11 is a diagram illustrating operations of the hand pitch limiter, and corresponds to the cross-sectional view taken along line IX-IX in FIG. 4.
Figure 12:
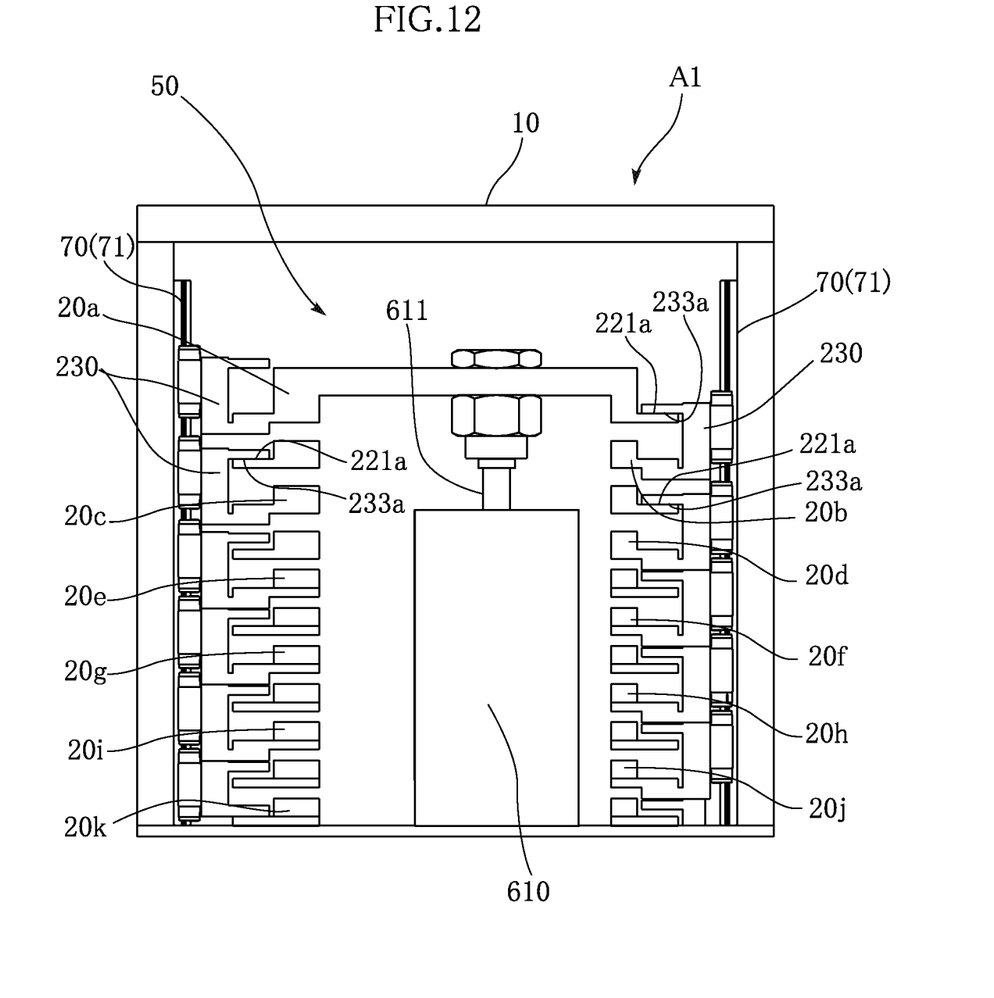
FIG. 12 is a diagram illustrating operations of the hand pitch limiter, and corresponds to the cross-sectional view taken along line IX-IX in FIG. 4.

When the piston rod 611 of the elevating mechanism 60 starts to rise from the state shown in FIG. 9, first, in the first-set abutting relationship portions R1, the upward abut portion 221a of the first hand 20a located at the top comes into contact with the downward abut portion 233a of the second hand 20b, and then the second hand 20b rises along with the first hand 20a (FIG. 10). Next, in the second-set abutting relationship portions R2, the upward abut portion 221a of the second hand 20b comes into contact with the downward abut portion 233a of the third hand 20c, and then the third hand 20c rises along with the first hand 20a and the second hand 20b (FIG. 11). Thereafter, similarly, the upward abut portion 221a of a hand 20 on the upper side comes into contact with the downward abut portion 233a of the hand 20 therebelow and lifts up that hand 20, and then ultimately, as shown in FIG. 13, the upward abut portions 221a of all of the hands 20 on the upper side abut against the downward abut portions 233a of the hands 20 therebelow. In the state shown in FIG. 13, the piston rod 611 of the elevating mechanism 60 can no longer rise any further. In the state shown in FIG. 9, the upward abut portions 221a of the hands 20 on the upper side and the downward abut portions 233a of the hands 20 immediately therebelow do not abut against each other and are separated by a predetermined distance L, and in the state shown in FIG. 13 in which the upward abut portions 221a of all of the hands 20 on the upper side abut against the downward abut portions 233a of the hands 20 immediately therebelow, the hand pitch has increased from the state shown in FIG. 9 by an amount equal to the distance L. At this time, the hand pitch is considered to be 10.0 mm, for example.

In this way, by raising/lowering the piston rod 611 of the elevating mechanism 60, the hand pitch of the multi-level hand apparatus A1 of the present embodiment can be changed to either of two levels, namely the maximum pitch and the minimum pitch. As understood from the above description, the configuration for changing the hand pitch of the multi-level hand apparatus A1 of the present embodiment can be almost entirely configured particularly in the planar area occupied by the support bodies 220 of the hands 20, and therefore the planar area occupied by the multi-level hand apparatus A1 does not increase even if the number of hands 20 increases.

Moreover, the hands 20 are grouped into the first-group hands 20a, 20c, 20e, 20g, 20i, and 20k at every other position and the remaining second-group hands 20b, 20d, 20f, 20h, and 20j, and therefore sets of the upward abut portions 221a of the first-group hands 20a, 20c, 20e, 20g, 20i, and 20k and the downward abut portions 233a of the second-group hands 20b, 20d, 20f, 20h, and 20j (first-set abutting relationship portions R1) can be arranged at different planar positions from sets of the upward abut portions 221a of the second-group hands 20b, 20d, 20f, 20h, and 20j and the downward abut portions 233a of the first-group hands 20a, 20c, 20e, 20g, 20i, and 20k (second-set abutting relationship portions R2). Accordingly, it is possible to reduce the minimum hand pitch and collectively convey a group of workpieces to and from cassettes that have a smaller pitch.

Next, operations of the clamp mechanisms 80 will be described.

Due to extension of a piston rod 824 of the air cylinder 821, which serves as the clamp driving mechanism 82, the clamp bodies 805 of the hands 20 move forward all at once and move in cooperation with the claws 211 of the hand bodies 210 so as to hold and prevent the falling of the workpieces W placed on the hand bodies 210. Conversely, due to retraction of the piston rod 824, the clamp bodies 805 of the hands 20 move rearward all at once, thus making it possible to release the holding of the workpieces W. Note that besides an air cylinder, any type of linear driven actuator can be used as the clamp movement mechanism 82.

Figure 14:
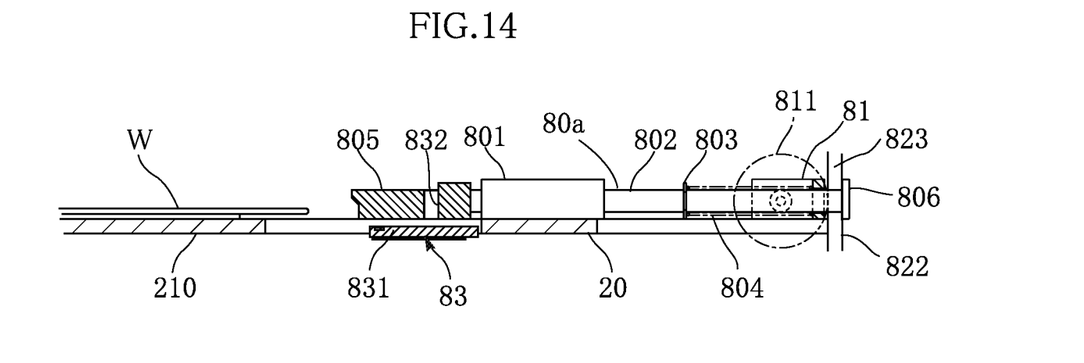
FIG. 14 is a diagram illustrating operations of the clamp mechanism and a clamp sensor.
Figure 15:
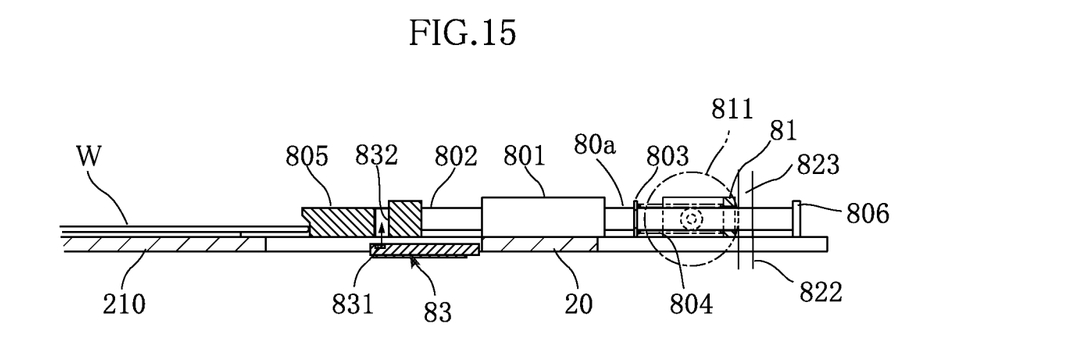
FIG. 15 is a diagram illustrating operations of the clamp mechanism and the clamp sensor.
Figure 16:
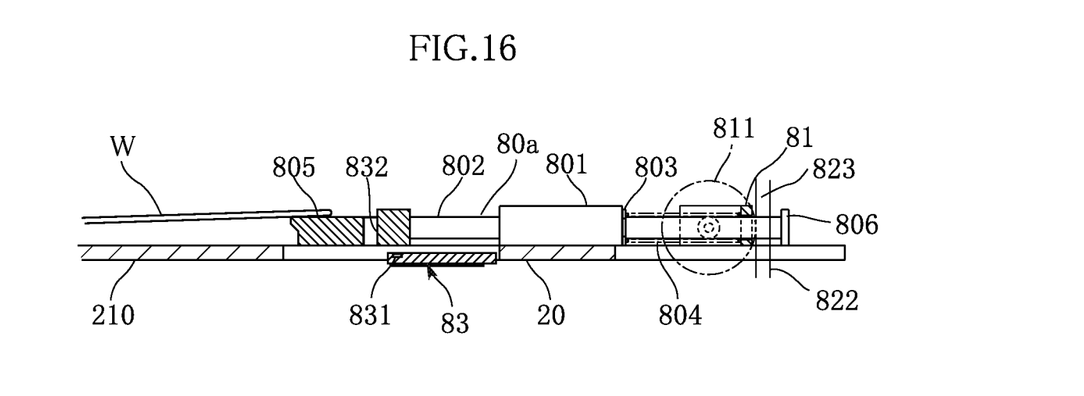
FIG. 16 is a diagram illustrating operations of the clamp mechanism and the clamp sensor.

As shown in FIGS. 14 to 16, when workpieces W are to be clamped by the clamp mechanisms 80 of the hands 20, the rods 802 receive forward drive force from the clamp driving mechanism 82 via the head member (moving body) 822 attached to the leading end of the piston rod 824. More specifically, the movable spring receiving members 81 are pushed forward via the rollers 811 that are in contact with the front surface of the head member 822, and the rods 802 receive forward elastic movement force via the compression coil springs 804 that are arranged between the spring receiving members 81 and the flanges (fixed spring receiving members) 803 (FIG. 14). After the workpieces W have entered the state of being held between the clamp bodies 805 and the claws 211, even if the head member 822 moves farther forward, the rods 802 and the clamp bodies 805 do not move forward any further, and the compression coil springs 804 become compressed (FIG. 15). In this way, the workpieces W are held by elastic pressing force applied by the clamp bodies 805, and therefore will not become damaged if subjected to impact while being held by the clamp bodies 805.

Note that while the workpieces W are held by the clamp mechanisms 82 in this way, that is to say while the clamp bodies 805 are in the forward state, if a workpiece W is not being held suitably, the compression coil spring 804 pushes the clamp body 805 forward beyond the suitable position for holding the workpiece W along with the claws 211 (FIG. 16). This unstable position of the clamp body 805 is detected when the limited reflection-type sensor 831, which serves as the clamp sensor 83, turns on. Due to this unsuitable position detection signal regarding the clamp body 805, it is possible to, for example, immediately stop the conveying robot B in order to avoid a problem that may occur thereafter.

In order to release the workpieces W from the clamp bodies 805, the head member 822 moves rearward and engages with the flanges 806 at the rear ends of the rods 802 such that the head member 822 pushes the rods 802 rearward, and thus the rods 802 and the clamp bodies 805 move rearward and the workpieces W are released.

At this time, the movable spring receiving members 81 are in elastic contact with the head member 822 that is engaged with the flanges 806 at the rear ends of the rods 802, and therefore the compression coil springs 804 do not become compressed between the movable spring receiving members 81 and the flanges (fixed spring receiving members) 803. In other words, when the workpieces are released, the head member 822 is substantially not influenced by the compression coil springs 804 pertaining to the clamp members 80a of the hands, and when the head member 822 moves rearward, the compression coil springs 804 do not become compressed. Accordingly, when the clamps are released, the moving body does not need to be held in the rearward state in resistance to the total biasing force of the springs that bias the clamp bodies 805 in the forward direction.

The rods 802 in the clamp mechanisms 82 of the hands 20 pass through the slit 823 of the head member (moving body) 822, and the rollers 811 of the spring receiving members 81 are in contact with and can roll on the front surface of the head member 822, and therefore the rods 802 can move in the vertical direction relative to the head member 822 with low resistance. Accordingly, while workpieces W are clamped by the hands 20, it is possible to prevent a problem such as excessive force being applied to the elevating mechanism 60 and the hands 20 in the vertical direction when the hand pitch of the hands 20 is changed from the maximum state to the minimum state, and when the hand pitch is changed from the minimum state to the maximum state. Also, regardless of whether the hand pitch is in the maximum state or the minimum state, the clamp mechanisms 82 of the hands 20 can operate all at once in order to hold workpieces W or release them.

Of course the scope of the present disclosure is not intended to be limited to the embodiment described above, and various changes within the range of the matter described in the claims are all encompassed in the scope of the present disclosure. In particular, the mechanism for changing the hand pitch is not limited to the configuration described in the above embodiment. Regarding the configuration for bringing the movable spring receiving members 81 and the head member (822) into contact while allowing relative movement in the vertical direction with low resistance, besides applying a configuration that uses the friction of rolling of the rollers 811 as in the above embodiment, it is also possible to use low-resistance sliding friction by, for example, coating the contact surfaces with Teflon (registered trademark) resin.

The invention claimed is:

1. A multi-level hand apparatus comprising:
a plurality of hands arranged in a vertical direction;
a plurality of clamp members disposed at the plurality of hands, respectively, each of the clamp members being movable in a forward-rearward direction to clamp and release a workpiece; and
a movable head member extending in the vertical direction,
wherein each of the clamp members includes a fixed spring receiving member, a movable spring receiving member movable in the forward-rearward direction, and a compression spring member arranged between the fixed spring receiving member and the movable spring receiving member, and
in each of the clamp members, the movable spring receiving member, as moving rearward, comes into contact with a front surface of the movable head member in a manner such that the movable spring receiving member is capable of moving in the vertical direction relative to the front surface.

2. The multi-level hand apparatus according to claim 1, wherein each of the clamp members includes a rod extending in the forward-rearward direction, and a clamp body disposed at a leading end of the rod for pressing a workpiece,
each of the hands is provided with a holder configured to support a portion of the rod that is forward of the fixed spring receiving member in a manner allowing the rod to move in the forward-rearward direction, and
the compression spring member is a compression coil spring surrounding the rod.

3. The multi-level hand apparatus according to claim 2, wherein in each of the hands, the movable spring receiving member includes a roller that comes into contact with and rolls on the front surface of the head member.

4. The multi-level hand apparatus according to claim 3, wherein each of the hands comprises an optical detector that optically detects unsuitable pressing of the workpiece by the clamp body when the clamp member is in the clamping state.

5. The multi-level hand apparatus according to claim 4, wherein in each of the hands, the optical detector includes a light receiving element provided on said each of the hand and a reflection state changing portion formed in the clamp body.

6. The multi-level hand apparatus according to claim 5, wherein in each of the hands, the reflection state changing portion is a through-hole passing through the clamp body in the vertical direction.

7. The multi-level hand apparatus according to claim 1, wherein pitches of the plurality of hands are variable.

8. A conveying robot comprising a multi-level hand apparatus according to claim 1.

* * * * *